United States Patent
Lin et al.

(10) Patent No.: US 7,700,988 B2
(45) Date of Patent: Apr. 20, 2010

(54) METAL-INSULATOR-METAL CAPACITOR

(75) Inventors: Cha-Hsin Lin, Tainan (TW);
Ching-Chiun Wang, Jhunan Township, Miaoli County (TW); Lurng-Shehng Lee, Chiudon Township, Hsinchu County (TW)

(73) Assignee: Industrail Technology Research Institute, Hsinchu (TW)

( * ) Notice: Subject to any disclaimer, the term of this patent is extended or adjusted under 35 U.S.C. 154(b) by 413 days.

(21) Appl. No.: 11/386,362

(22) Filed: Mar. 21, 2006

(65) Prior Publication Data

US 2007/0141778 A1 Jun. 21, 2007

(30) Foreign Application Priority Data

Dec. 21, 2005 (TW) .............................. 94145498 A

(51) Int. Cl.
*H01L 27/108* (2006.01)
*H01L 29/94* (2006.01)

(52) U.S. Cl. .................. 257/310; 257/532; 257/303; 257/296; 257/306; 438/253

(58) Field of Classification Search .............. 257/532, 257/303, 296, 306; 438/253
See application file for complete search history.

(56) References Cited

U.S. PATENT DOCUMENTS

| 5,753,945 | A | 5/1998 | Chivukula et al. | .......... 257/295 |
| 6,433,380 | B2 | 8/2002 | Shin | ........................... 257/310 |
| 7,393,736 | B2 * | 7/2008 | Ahn et al. | .................... 438/197 |
| 2003/0025212 | A1 * | 2/2003 | Bhat et al. | ................... 257/780 |
| 2003/0165693 | A1 * | 9/2003 | Hartig et al. | ................. 428/426 |
| 2004/0043557 | A1 * | 3/2004 | Haukka et al. | .............. 438/240 |
| 2004/0119141 | A1 * | 6/2004 | Schreiter et al. | ............ 257/532 |
| 2006/0151823 | A1 * | 7/2006 | Govindarajan | .............. 257/310 |

OTHER PUBLICATIONS

"High dielectric constant $TiO_2$ thin films on a Ru electrode grown at 250°C by atomic-layer deposition" Seong Keun Kim, 2004 American Institute of Physics, vol. 85, No. 18, Nov. 2004, pp. 4112-4114.
"Characteristics of $TiO_2$ Films prepared by ALD With and Without Plasma" Jung Wook Lim, Electrochemical and Solid-State letters, vol. 7, 2004, pp. F73-F76.
Chinese First Examination Report of China Application No. 2005101322198, dated Sep. 18, 2009.

* cited by examiner

*Primary Examiner*—Kenneth A Parker
*Assistant Examiner*—David Z Chen
(74) *Attorney, Agent, or Firm*—J.C. Patents

(57) ABSTRACT

A metal-insulator-metal (MIM) capacitor having a top electrode, a bottom electrode and a capacitor dielectric layer is provided. The top electrode is located over the bottom electrode and the capacitor dielectric layer is disposed between the top and the bottom electrode. The capacitor dielectric layer comprises several titanium oxide ($TiO_2$) layers and at least one tetragonal structure material layer. The tetragonal structure material layer is disposed between two titanium oxide layers and each tetragonal structure material layer has the same or a different thickness. Leakage path can be cut off through the tetragonal material layer between the titanium oxide layers. In the meantime, the tetragonal structure material layer can induce the titanium oxide layers to transform into a high k rutile phase.

5 Claims, 1 Drawing Sheet

METAL-INSULATOR-METAL CAPACITOR

CROSS-REFERENCE TO RELATED APPLICATION

This application claims the priority benefit of Taiwan application serial no. 94145498, filed on Dec. 21, 2005. All disclosure of the Taiwan application is incorporated herein by reference.

BACKGROUND OF THE INVENTION

1. Field of the Invention

The present invention generally relates to a metal-insulator-metal (MIM) capacitor. More particularly, the present invention relates to a MIM capacitor with high dielectric constant (k) capacitor dielectric layer and low leakage current.

2. Description of the Related Art

The major components of a semiconductor memory include transistors and capacitors. When the process of fabricating a semiconductor memory involves a high aspect ratio process, the space available for forming the capacitor inside the device will be substantially reduced. Due to the rapid increase in the memory space needed to operate computer software, the required capacitance of capacitors is also increased. Therefore, some modification to the conventional method of fabricating semiconductor device is required in order to meet this increased capacitance demand.

At present, one of the principle methods of increasing the capacitance without consuming space includes using a high dielectric constant (high k) material layer to serve as the insulating layer for producing a MIM capacitor so that sufficient capacitance is produced within the confines of a diminished capacitor area. Titanium oxide ($TiO_2$) is one of the capacitor dielectric materials having a high dielectric constant commonly used in a MIM capacitor. Furthermore, it is found that the titanium oxide material has a dielectric constant k over and above 100 when it is composed of the rutile phase. However, to transform the titanium oxide layer in the anatase phase produced by the ordinary atomic layer deposition (ALD) method into the rutile phase, a high temperature baking (at a temperature more than 700° C.) process is required to activate the phase transition. Such a high processing temperature often induces some damage to the material layer. In addition, leakage current is a serious problem that needs to be solved due to the small band gap of titanium oxide material.

SUMMARY OF THE INVENTION

Accordingly, at least one objective of the present invention is directed to a MIM capacitor capable of increasing the dielectric constant of a titanium oxide ($TiO_2$) capacitor dielectric layer without damaging other material layers.

At least another objective of the present invention is to provide a MIM capacitor that not only increases the dielectric constant of a titanium oxide ($TiO_2$) capacitor dielectric layer, but also improve the current leak problem in the titanium oxide ($TiO_2$) capacitor dielectric layer.

To achieve these and other advantages and in accordance with the purpose of the invention, as embodied and broadly described herein, the invention provides a MIM capacitor. The MIM capacitor includes a top electrode, a bottom electrode and a capacitor dielectric layer. The top electrode is located over the bottom electrode and the capacitor dielectric layer is disposed between the top and the bottom electrode. The capacitor dielectric layer comprises several titanium oxide ($TiO_2$) layers and at least one tetragonal structure material layer. The tetragonal structure material layer is disposed between two titanium oxide layers and each tetragonal structure material layer has the same thickness.

According to the MIM capacitor in one embodiment of the present invention, the material of the aforementioned tetragonal structure material layer is a material having a band gap greater than titanium oxide ($TiO_2$). For example, the material of the tetragonal structure material layer includes zirconium oxide ($ZrO_2$), lead oxide ($PbO_2$), tin oxide ($SnO_2$), barium oxide ($BaO_2$) or strontium oxide ($SrO_2$).

According to the MIM capacitor in one embodiment of the present invention, each tetragonal structure material layer has a thickness between about 0.5 Å to 200 Å.

According to the MIM capacitor in one embodiment of the present invention, the number of the tetragonal structure material layers is from 1 to 300.

The present invention also provides an alternative MIM capacitor. The MIM capacitor includes a top electrode, a bottom electrode and a capacitor dielectric layer. The top electrode is located over the bottom electrode and the capacitor dielectric layer is disposed between the top and the bottom electrode. The capacitor dielectric layer comprises a plurality of alternately stacked tetragonal structure material layers and titanium oxide ($TiO_2$) layers. Furthermore, the thicknesses of the tetragonal structure material layers gradually increase from the middle layer in the capacitor dielectric layer toward the top electrode and the bottom electrode.

According to the MIM capacitor in another embodiment of the present invention, the material of the aforementioned tetragonal structure material layers is a material having a band gap greater than titanium oxide ($TiO_2$). For example, the materail of the tetragonal structure material layer includes zirconium oxide ($ZrO_2$), lead oxide ($PbO_2$), tin oxide ($SnO_2$), barium oxide ($BaO_2$) or strontium oxide ($SrO_2$).

According to the MIM capacitor in another embodiment of the present invention, each tetragonal structure material layer has a thickness between about 0.5 Å to 200 Å.

According to the MIM capacitor in another embodiment of the present invention, the number of the tetragonal structure material layers is from 3 to 300.

In the present invention, the capacitor dielectric layer of the MIM capacitor comprises alternately stacked tetragonal structure material layers and titanium oxide layer. Hence, leakage path can be cut off through the tetragonal material layer disposed between the titanium oxide layers, and in the meantime, the titanium oxide layers can be induced by the tetragonal structure material layers to transform into a rutile phase with a higher dielectric constant k.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
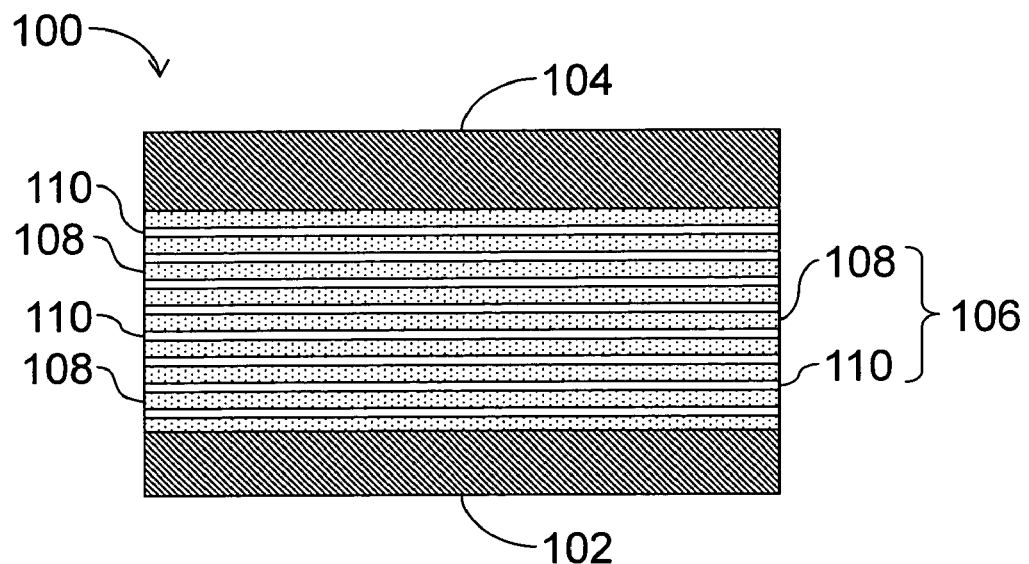
FIG. 1 is a schematic cross-sectional view of a MIM capacitor according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of a MIM capacitor according to one preferred embodiment of the present invention. As shown in FIG. 1, the MIM capacitor 100 in the present embodiment includes a bottom electrode 102, a top electrode 104 and a capacitor dielectric layer 106. The top electrode 104 is disposed over the bottom electrode 102 and the capacitor dielectric layer 106 is disposed between the top electrode 104 and the bottom electrode 102. The capacitor dielectric layer 106 mainly comprises a titanium oxide ($TiO_2$) layer 108 and at least one tetragonal structure material layer 110. The tetragonal structure material layer 110 is disposed between two titanium oxide layers 108. Furthermore, each tetragonal structure material layer 110 has the same thickness so that this type of films can be produced through a repeated process using the same processing parameters. For instance, the material of the tetragonal structure material layer 110 includes a material having a band gap greater than the titanium layer. For example, the material of the tetragonal structure material layer 110 includes zirconium oxide ($ZrO_2$), lead oxide ($PbO_2$), tin oxide ($SnO_2$), barium oxide ($BaO_2$), strontium oxide ($SrO_2$) or other suitable material. Each tetragonal structure material layer 110 has a thickness between about 0.5 Å to 200 Å and the total number of the tetragonal structure material layers 110 in the capacitor dielectric layer is from 1 to 300. In addition, the thickness of each titanium oxide layer 108 has the same thickness or a different thickness.

Figure 2:
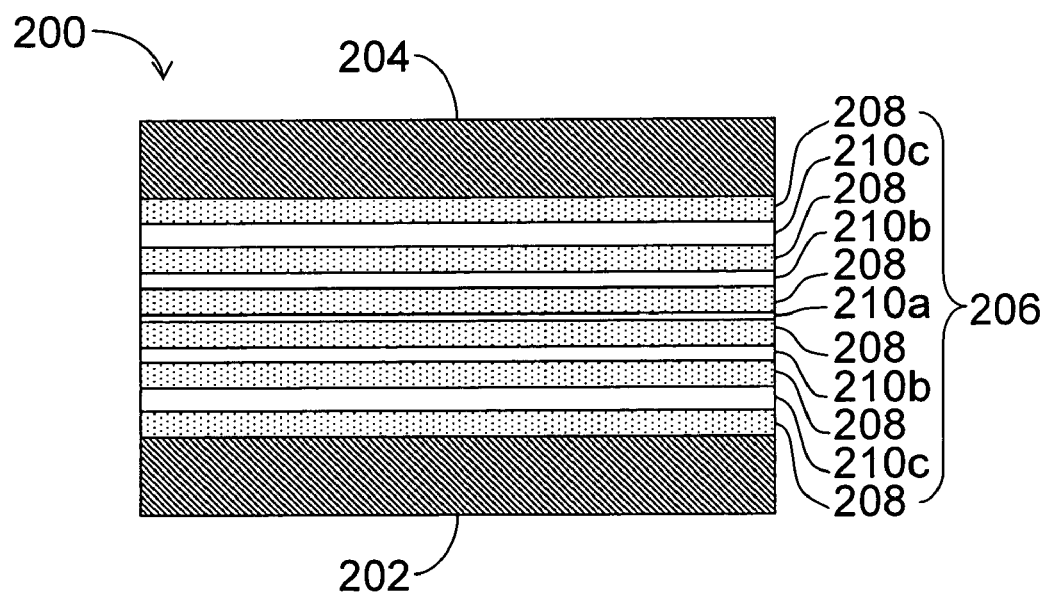
FIG. 2 is a schematic cross-sectional view of a MIM capacitor according to another preferred embodiment of the present invention.

FIG. 2 is a schematic cross-sectional view of a MIM capacitor according to another preferred embodiment of the present invention. As shown in FIG. 2, the MIM capacitor 200 is very similar to the one in the first embodiment. The MIM capacitor 200 also comprises a bottom electrode 202, a top electrode 204 and a capacitor dielectric layer 206. The main difference is that the capacitor dielectric layer 206 includes alternately stacked tetragonal structure material layers 210a, 210b, 210c and titanium oxide layers 208. Furthermore, the tetragonal structure material layers 210a, 210b, 210c have thicknesses that gradually increase from the middle layer toward the top electrode 204 and the bottom electrode 202. In the diagram, the tetragonal structure material layer 210a in the middle is the thinnest and the tetragonal structure material layers 210c closest to the top electrode 204 and the bottom electrode 202 are the thickest. Therefore, through the gradual increase in thickness of the tetragonal structure material layers from the middle of the capacitor dielectric layer, the leakage path is additionally cut off. Moreover, the material of the tetragonal structure material layers 210a, 210b, 210c includes a material with band gap greater than the titanium oxide such as zirconium oxide ($ZrO_2$), lead oxide ($PbO_2$), tin oxide ($SnO_2$), barium oxide ($BaO_2$), strontium oxide ($SrO_2$) or other suitable material. Each of tetragonal structure material layers 210a, 210b, 210c has a thickness between about 0.5 Å to 200 Å and the total number of the tetragonal structure material layers in the capacitor dielectric layer is from 3 to 300 depending on the actual requirements. In addition, the thickness of each titanium oxide layer 208 can have the same thickness or a different thickness according to the design requirements.

In summary, the capacitor dielectric layer of the MIM capacitor in the present invention comprises alternately stacked tetragonal structure material layers and titanium oxide layer. Hence, leakage path can be cut off through the larger band gap tetragonal material layer disposed between the titanium oxide layers. In the meantime, the titanium oxide layers can be induced by the tetragonal structure material layers to transform into a rutile phase with a higher dielectric constant k.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A metal-insulator-metal (MIM) capacitor, comprising:
   a bottom electrode;
   a top electrode disposed over the bottom electrode; and
   a capacitor dielectric layer disposed between the top electrode and the bottom electrode, wherein the capacitor dielectric layer comprises:
      a plurality of titanium oxide ($TiO_2$) layers; and
      at least one tetragonal structure material layer disposed between the titanium oxide layers, wherein each tetragonal structure material layer has the same thickness, wherein the material constituting the tetragonal structure material layers includes lead oxide ($PbO_2$), tin oxide ($SnO_2$), barium oxide ($BaO_2$) or strontium oxide ($SrO_2$), wherein
      one of the plurality of $TiO_2$ layers is directly contacted with the top electrode, and another of the plurality of $TiO_2$ layers is directly contacted with the bottom electrode.

2. The MIM capacitor of claim 1, wherein the material of the tetragonal structure material layer comprising a material having a band gap greater than titanium oxide.

3. The MIM capacitor of claim 1, wherein each tetragonal structure material layer has a thickness between about 0.5 angstrom (Å) to 200 angstrom(Å).

4. The MIM capacitor of claim 1, wherein the number of the tetragonal structure material layers in the capacitor dielectric layer is from 1 to 300.

5. A metal-insulator-metal (MIM) capacitor, comprising:
   a bottom electrode;
   a top electrode disposed over the bottom electrode; and
   a capacitor dielectric layer disposed between the top electrode and the bottom electrode, wherein the capacitor dielectric layer comprises:
      a plurality of titanium oxide ($TiO_2$) layers; and
      at least one tetragonal structure material layer disposed between the titanium oxide layers, wherein the material constituting the tetragonal structure material layers includes lead oxide ($PbO_2$), tin oxide ($SnO_2$), barium oxide ($BaO_2$) or strontium oxide ($SrO_2$), wherein
      one of the plurality of $TiO_2$ layers is directly contacted with the top electrode, and another of the plurality of $TiO_2$ layers is directly contacted with the bottom electrode.

* * * * *